US 9,496,864 B2

(12) United States Patent
Wagoner et al.

(10) Patent No.: US 9,496,864 B2
(45) Date of Patent: Nov. 15, 2016

(54) GATE DRIVE CIRCUIT AND METHOD OF OPERATING SAME

(71) Applicant: General Electric Company, Schenectady, NY (US)

(72) Inventors: Robert Gregory Wagoner, Roanoke, VA (US); Todd David Greenleaf, Salem, VA (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 14/574,548

(22) Filed: Dec. 18, 2014

(65) Prior Publication Data

US 2016/0182034 A1   Jun. 23, 2016

(51) Int. Cl.
  *H03K 17/567*   (2006.01)
  *H03K 17/16*    (2006.01)

(52) U.S. Cl.
  CPC .......... *H03K 17/567* (2013.01); *H03K 17/163* (2013.01); *H03K 17/166* (2013.01); *H03K 17/168* (2013.01); *H03K 2217/0036* (2013.01)

(58) Field of Classification Search
  CPC .......... H03K 3/012; H03K 5/13; H03K 17/18; H03K 17/56; H03K 17/163; H03K 17/6871; H03K 17/6872
  USPC .......... 327/108, 109, 110, 111, 112
  See application file for complete search history.

(56) References Cited

U.S. PATENT DOCUMENTS

| 5,926,012 | A | 7/1999 | Takizawa et al. |
| 6,208,185 | B1 | 3/2001 | John et al. |
| 7,274,243 | B2 * | 9/2007 | Pace ...................... H02M 7/538 327/396 |
| 7,710,187 | B2 | 5/2010 | Hiyama |
| 2005/0052217 | A1 | 3/2005 | Furuie et al. |
| 2009/0066402 | A1 | 3/2009 | Hiyama |
| 2011/0133790 | A1 | 6/2011 | Nagata et al. |
| 2011/0228564 | A1 | 9/2011 | Uruno et al. |

(Continued)

FOREIGN PATENT DOCUMENTS

EP   2 811 632 A1   12/2014

OTHER PUBLICATIONS

EiceDRIVER™ Application Note, Feb. 28, 2012, 26 pages.

(Continued)

*Primary Examiner* — John Poos
(74) *Attorney, Agent, or Firm* — Dority & Manning, P.A.

(57) ABSTRACT

A gate drive circuit for applying a voltage to a gate of a semiconductor switching device is disclosed. The gate drive circuit includes a gate drive controller that provides voltage commands for operating the semiconductor switching device, a plurality of primary gate resistors coupled between the gate drive controller and the semiconductor switching device, one or more secondary gate resistors connected in parallel with the primary gate resistors, a primary transistor connected in series with each of the primary gate resistors, and a secondary transistor connected in series with each of the secondary gate resistors. Further, one of the primary or secondary transistors receives the one or more voltage commands from the gate drive controller and provides one or more corresponding voltage levels to the semiconductor switching device via one of the primary or secondary gate resistors so as to control the on-off behavior of the semiconductor switching device.

19 Claims, 9 Drawing Sheets

(56) References Cited

U.S. PATENT DOCUMENTS

| | | | |
|---|---|---|---|
| 2012/0032710 A1 | 2/2012 | Tsukada | |
| 2013/0021067 A1 | 1/2013 | Lee et al. | |
| 2013/0234435 A1* | 9/2013 | Wagoner | H02P 9/007 290/44 |
| 2014/0203860 A1 | 7/2014 | Senda | |

OTHER PUBLICATIONS

EiceDRIVER™ Industrial Power Control Final Data Sheet 1ED020I112-FT, Jul. 31, 2012, 32 pages.
Chokhawala et al., "Gate Drive Considerations for IGBT Modules", IEEE Transactions on Industry Applications, vol. 31, Issue 3, May/Jun. 1995, pp. 1186-1195.
Heer et al., "Simple Turn-Off Description of Trench-Field-Stop IGBT-IGBT$^3$/3.3kV", PCIM Power Electronic Conference, vol. 2, Nuremburg, Germany, May 8-10, 2012—6 pages.
Hong et al., "Robustness Improvement of High-Voltage IGBT by Gate Control", Infineon Technologies, 3 pages.
Infineon, Application Note "Switching Behavior and Optimal Driving of IGBT$^3$ Modules", www.eupec.com—6 pages.
Luniewski et al, "Dynamic Voltage Rise Control, the Most Efficient Way to Control Turn-off Switching Behaviour of IGBT Transistors", Pelincec Conference, Oct. 16-19, 2005, Warsaw, Poland, pp. 80-86.
Rahimo et al., "Freewheeling Diode Reverse Recovery Failure Modes in IGBT Applications", IEEE Transactions on Industry Applications, vol. 37, Issue 2, Mar./Apr. 2001, pp. 661-670.
Related U.S. Appl. No. 14/101,579, filed Dec. 10, 2013.
EP Search Report, Apr. 19, 2016.

\* cited by examiner

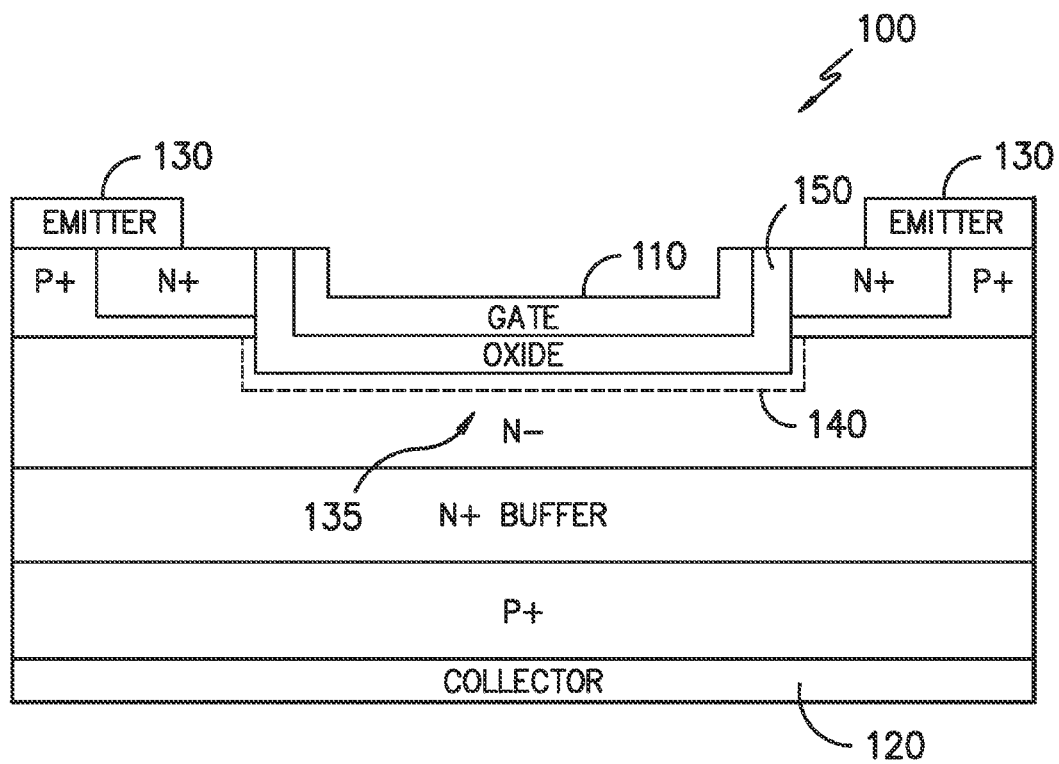
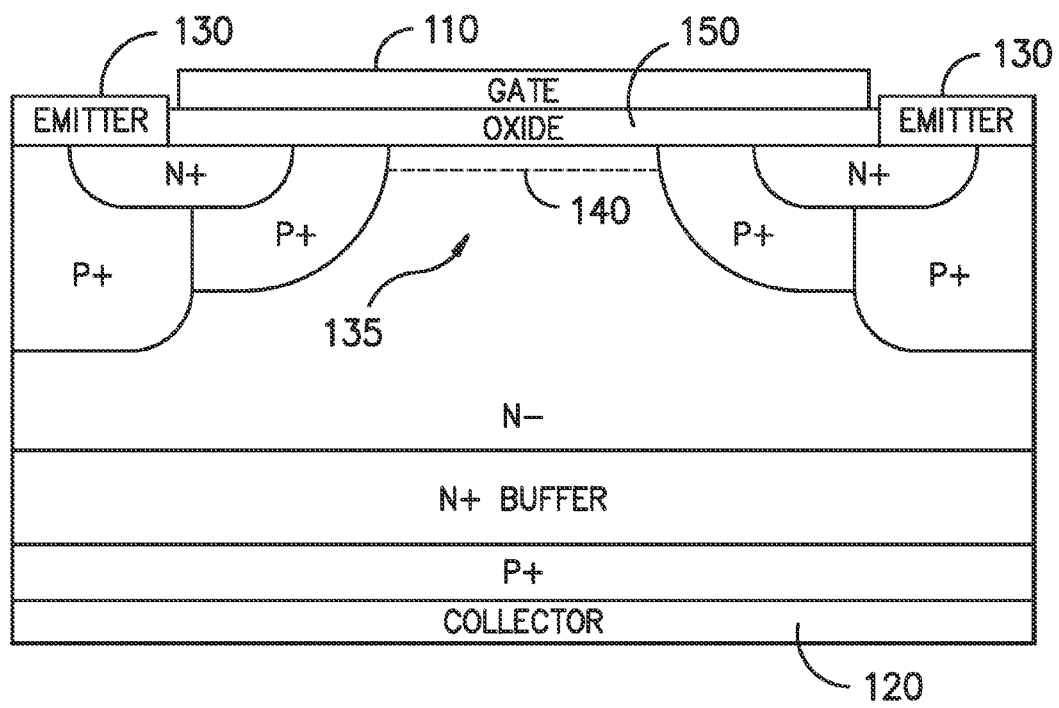
FIG. 2

US 9,496,864 B2

GATE DRIVE CIRCUIT AND METHOD OF OPERATING SAME

FIELD OF THE INVENTION

The present disclosure relates generally to gate drive circuits for semiconductor devices, and more particularly to gate drive circuits for applying a gate voltage to a gate of a semiconductor switching device.

BACKGROUND OF THE INVENTION

Semiconductor devices such as insulated gate bipolar transistors (IGBTs) can be used in many electrical systems as electronic switching elements for a variety of applications. For instance, IGBTs can be used in bridge circuits of a power converter to convert alternating current (AC) power to direct current (DC) power, and vice versa. The IGBT transfers current in a single direction, therefore, an anti-parallel" or a "freewheeling diode" is often coupled in parallel with the IGBT to allow current to flow in the reverse direction.

IGBTs typically include three terminals, including a gate, a collector, and an emitter. The IGBT can be operated as a switching element by controlling the gate-emitter voltage using a gate drive circuit. For instance, when the gate-emitter voltage exceeds a threshold voltage for the IGBT, the IGBT can be turned on such that current can flow through the collector and emitter of the IGBT. When the gate-emitter voltage is less than the threshold voltage for the IGBT, the IGBT can be turned off such that current flow through the collector and emitter is limited. During operation of the IGBT, it is important to turn the IGBT on and off quickly to reduce turn-off loss. Reducing the turn-off gate resistance associated with the IGBT can allow the IGBT to turn off quicker. For example, FIG. 1 illustrates a block diagram of a conventional gate drive circuit 10 for turning the IGBT 12 on and off As shown, the gate drive circuit 10 has a simple ON/OFF configuration for control of the IGBT 12 via gate drive controller 22. More specifically, the controller 22 sends one or more voltage commands, namely P15_ON or N9_OFF, to one of the field-effect transistors 14, 16. The transistors 14, 16 then send a corresponding voltages level (i.e. +15V or −9V) to the IGBT 12 gate through one of the resistors 18, 20.

During typical IGBT turn off, a parasitic miller capacitance from the gate-collector works in conjunction with the turn-off gate resistance to control the rate of voltage changes (dv/dt) of the collector-emitter voltage. However, a typical IGBT structure has inherent properties that limit the speed at which an IGBT can be turned off. More particularly, as explained in more detail below, when the gate-emitter voltage is negative with respect to a drift region of the IGBT, an adjoining drift region to a gate oxide layer tends toward inversion and becomes a shunt for displacement charge from the collector through the shunt to the emitter.

For instance, FIG. 2 depicts a plurality of example IGBT structures 100 that can be used in a variety of applications. The example IGBT structures 100 are provided for purposes of illustration and discussion. As shown, each IGBT structure 100 includes a gate 110, a collector 120, and an emitter 130. A gate oxide layer 150 is located adjacent to the gate 110.

Each IGBT structure 100 can include a drift region 135 where under blocking conditions, the majority of the voltage is accumulated. For increasing blocking on the IGBT, displacement current can flow to the gate 110 unless the gate 110 becomes oppositely biased with respect to the emitter 130, at which point that negative bias will force the like polarity carriers out of the drift region 135 away from the proximity of the gate oxide layer 150. Displacement currents can then use the channel 140 that is formed to the emitter 130, rather than using the gate drive as a way to travel to the emitter 130. The channel 140 that is formed provides a path or "shunt" connecting to a P+ region adjacent to the emitter 130. Having an inverted charge in the N− region near the gate oxide layer 150 can create a blocking region, causing the current from the miller capacitance to flow into the emitter 130 instead of the gate 150.

The presence of the inversion shunt or channel 140 can affect the miller capacitance of the IGBT during turn off. For instance, if the inversion shunt 140 is allowed to exist when the IGBT is turning off and collector current is still flowing, the natural feedback of the miller capacitance of the IGBT can be bypassed. This can reduce the effect of miller capacitance on the rate of voltage changes (dv/dt) of the collector-emitter voltage, allowing the IGBT to potentially have an overvoltage of the collector-emitter voltage during turn off.

In addition, quicker turn on of the IGBT can lead to "snap off" behavior of a freewheeling diode coupled in parallel with the other IGBT of a phase leg during reverse recovery of the diode. The "snap off" behavior (i.e. high rate of change (di/dt) of reverse recovery current in the diode) can lead to collector-emitter voltage $V_{CE}$ spikes due to parasitic inductance in the circuit. This in turn can lead to damage the diode and can ultimately cause a circuit failure.

Thus, a need exists for an improved gate drive circuit that can provide improved control of the rate of voltage changes (dv/dt) of the collector-emitter voltage during semiconductor turn off. More specifically, a gate drive circuit that provides for control of voltage change rates of the collector-emitter voltage during a period of time when a freewheeling diode is experiencing diode reverse recovery would be particularly useful.

BRIEF DESCRIPTION OF THE INVENTION

Aspects and advantages of the invention will be set forth in part in the following description, or may be obvious from the description, or may be learned through practice of the invention.

One example aspect of the present disclosure is directed to a gate drive circuit for applying a gate voltage to a gate of a semiconductor switching device. The gate drive circuit includes a gate drive controller providing one or more voltage commands for operating the semiconductor switching device, a plurality of primary gate resistors coupled between the gate drive controller and the semiconductor switching device, a primary transistor connected in series with each of the primary gate resistors, and one or more secondary transistors connected in parallel with the primary gate resistors. Further, one of the primary or secondary transistors receives the one or more voltage commands from the gate drive controller and provides one or more corresponding voltage levels to the semiconductor switching device so as to control the on-off behavior of the semiconductor switching device.

In one embodiment, the gate drive circuit further includes one or more secondary gate resistors connected in parallel with the primary gate resistors. In another embodiment, at least one secondary transistor is connected in series with each of the secondary gate resistors.

In a further embodiment, the semiconductor switching device is an insulated gate bipolar transistor (IGBT). Thus, in particular embodiments, the IGBT may be configured with a bridge circuit of a power converter of a wind-drive power generation system. In another embodiment, the primary and secondary transistors are metal-oxide-semiconductor field-effect transistors (MOSFETs). In certain embodiments, the gate drive circuit further includes at least one diode connected in series with the secondary MOSFETs.

In additional embodiments, the voltage level includes a first voltage configured to turn on the semiconductor switching device via a first primary gate resistor, the first voltage being greater than a threshold voltage for the semiconductor switching device. In another embodiment, the voltage level may include a second voltage configured to turn off the semiconductor switching device via a second primary gate resistor, the second voltage being less than the threshold voltage.

In yet another embodiment, during turn off of the semiconductor switching device, the gate drive controller may be configured to apply a third voltage to the gate of the semiconductor switching device via a second secondary gate resistor for a first turn off period, the third voltage being less than the first voltage but greater than the second voltage. In further embodiments, the gate drive controller is further configured to apply a fourth voltage to the gate of the semiconductor switching device via a fourth secondary gate resistor for a second turn off period, the fourth voltage being less than the third voltage but greater than the second voltage.

In yet another embodiment, during turn on of the semiconductor switching device, the gate drive controller is further configured to apply the fourth voltage to the gate of the semiconductor switching device via a third secondary gate resistor for a first turn on period, the fourth voltage being less than the third voltage but greater than the second voltage. In further embodiments, the gate drive controller is further configured to apply the third voltage to the gate of the semiconductor switching device via a first secondary gate resistor for a second turn on period, the third voltage being less than the first voltage but greater than the second voltage.

In another aspect, the present disclosure is directed to a bridge circuit used in a power converter of a power system. The bridge circuit includes a first insulated gate bipolar transistor (IGBT) having a gate, a collector, and an emitter, a second IGBT coupled in series with the first IGBT, a diode coupled in parallel with the first IGBT, and a gate drive circuit configured to apply a voltage to the gate of the first IGBT. In addition, the gate drive circuit includes a gate drive controller providing one or more voltage commands for operating the first IGBT, a plurality of primary gate resistors coupled between the gate drive controller and the first IGBT, one or more secondary gate resistors connected in parallel with the primary gate resistors, a primary transistor connected in series with each of the primary gate resistors, and a secondary transistor connected in series with each of the secondary gate resistors. Further, one of the primary or secondary transistors receives the one or more voltage commands from the gate drive controller and provides one or more corresponding voltage levels to the semiconductor switching device via one of the primary or secondary gate resistors so as to control the on-off behavior of the semiconductor switching device.

In yet another aspect, the present disclosure is directed to a method of gating an insulated gate bipolar transistor (IGBT) used in a power converter of a wind-driven power generation system. The method includes applying a first voltage via a first primary gate resistor to a gate of the IGBT to turn on the IGBT, the first voltage being greater than a threshold voltage for the IGBT. Another step includes receiving a turn off signal to turn off the IGBT. During turn off of the IGBT, the method further includes applying one or more intermediate voltages near the threshold voltage via a plurality of secondary gate resistors to control the IGBT in a small signal manner. The method also includes applying a second voltage via a second primary gate resistor to the gate of the IGBT to turn off the IGBT subsequent to receiving the turn off signal, the second voltage being less than the threshold voltage. Subsequently, the method may also include receiving a turn on signal to turn on the IGBT. Thus, during turn on of the IGBT, the method may also include applying the one or more intermediate voltages in an opposite order via the one or more secondary gate resistors to control the IGBT in a small signal manner.

Variations and modifications can be made to these example aspects of the present disclosure.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended figures, in which:

FIG. 2 illustrates example IGBT structures;

DETAILED DESCRIPTION OF THE INVENTION

Figure 1:
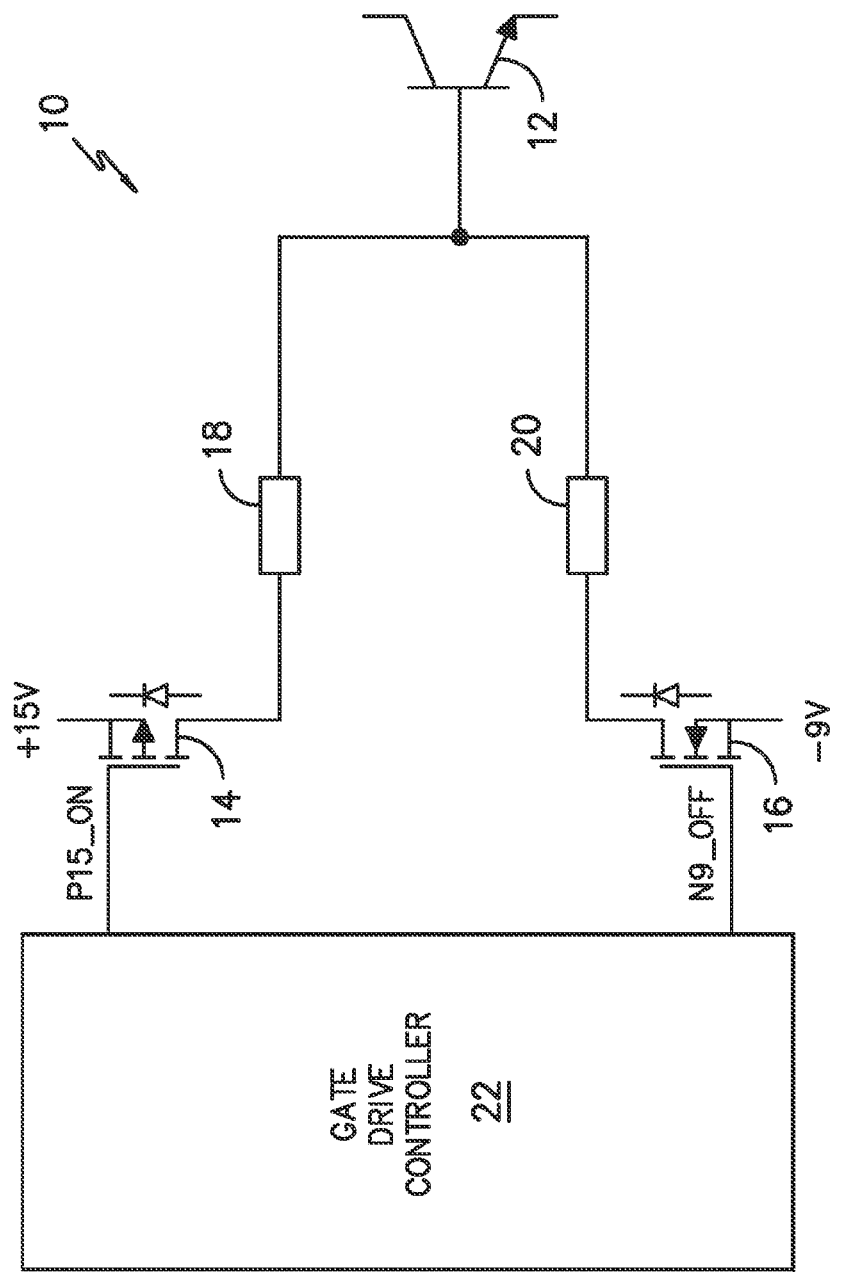
FIG. 1 illustrates one embodiment of a gate drive circuit according to conventional construction.

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment.

Thus, it is intended that the present invention covers such modifications and variations as come within the scope of the appended claims and their equivalents.

Generally, example aspects of the present disclosure are directed to high performance gate drive circuits for driving semiconductor switching devices, such as insulated gate bipolar transistors (IGBTs). More specifically, in one embodiment, the gate drive circuit according to aspects of the present disclosure includes a gate drive controller that provides one or more voltage commands for operating an IGBT. The gate drive circuit also includes a plurality of primary gate resistors coupled between the gate drive controller and the IGBT and one or more optional secondary gate resistors connected in parallel with the primary gate resistors. Further, the gate drive circuit includes a primary transistor connected in series with each of the primary gate resistors and a secondary transistor connected in series with each of the secondary gate resistors. Thus, one of the primary or secondary transistors receives the voltage commands from the gate drive controller and provides one or more corresponding voltage levels to the IGBT via one of the primary or secondary gate resistors so as to control the on-off behavior of the IGBT.

Thus, the gate drive circuits of the present disclosure can provide improved control of rate of collector-emitter voltage changes (dv/dt) and/or rate of collector current changes (di/dt) during turn off and turn on of the IGBT. As a result, the gate drive circuits of the present disclosure have faster switching times and reduced switching losses through the use of lower values of gate resistance. The present disclosure is discussed with reference to driving IGBTs for purposes of illustration and discussion. Those of ordinary skill in the art, using the disclosures provided herein, will understand that certain aspects of the present disclosure are also applicable to other semiconductor switching devices.

An example high performance gate drive circuit according to embodiments of the present disclosure can control the gate voltage applied to the gate of the IGBT to one or more intermediate voltages between the IGBT gate "on" voltage and the gate "off" voltage. For instance, the intermediate voltage level can be applied by the gate drive circuit as long as the collector current for the IGBT is non-zero.

According to particular aspects of the present disclosure, the gate-emitter voltage of the IGBT can be controlled in a small signal manner during IGBT turn off and turn on. More particularly, the gate-emitter voltage can be slightly below the threshold voltage so that the current from the dv/dt through the miller capacitance makes the gate voltage at the IGBT itself to be near the threshold voltage. When the IGBT is controlled in a small signal manner during turn off and/or turn on, the IGBT can be an effective snubber circuit for a freewheeling diode coupled in parallel with the IGBT which can be physically very close to the IGBT.

Aspects of the present disclosure will now be discussed with reference to applying a first voltage, a second voltage, a third voltage, and a fourth voltage to a gate of an IGBT. The use of the terms "first," "second," "third", and "fourth" are used to differentiate between the voltage levels and are not used to indicate either magnitude or order of sequence of the voltages applied to the gate of the IGBT.

More particularly, the gate drive controller of the gate drive circuit according to an example embodiment of the present disclosure is configured to apply a first voltage above the threshold voltage of the IGBT to the gate of the IGBT to turn on the IGBT and to apply a second voltage below the threshold voltage of the IGBT to the gate of the IGBT to turn off the IGBT. The second voltage can be the lowest of all voltages applied to the gate of the IGBT. When the first voltage or the second voltage is applied to the gate of the IGBT, the IGBT is operated in a large signal manner, effectively causing the IGBT to be fully on during application of the first voltage or fully off during application of the second voltage.

During IGBT turn off, the IGBT can be controlled in a small signal manner such that the gate-emitter voltage of the IGBT is near the threshold voltage. More particularly, a third voltage can be applied to the gate of the IGBT by the gate drive controller to control dv/dt of the collector-emitter voltage and di/dt of the collector current during a first turn off period. The third voltage can be a positive voltage that is less than the first voltage and greater than the second voltage.

In addition, a fourth voltage can be applied to the gate of the IGBT during a second turn off period that is subsequent to the first turn off period. The fourth voltage can be less than the third voltage and greater than the second voltage. The second turn off period can correspond to a period of reverse recovery of a freewheeling diode coupled in parallel with the IGBT. The fourth voltage can provide protection to the diode during reverse recovery. For instance, the fourth voltage can be applied to protect the diode from transient reverse voltage as a result of diode "snap off" behavior. The fourth voltage can be set to allow normal diode dv/dt of the collector-emitter voltage plus margin so that only the high dv/dt that occurs during "snap off" is limited by the feedback loop of the miller capacitance in the IGBT. Similarly, during IGBT turn on, the IGBT may also be controlled in a small signal manner such that the gate-emitter voltage of the IGBT is near the threshold voltage.

Figure 3:
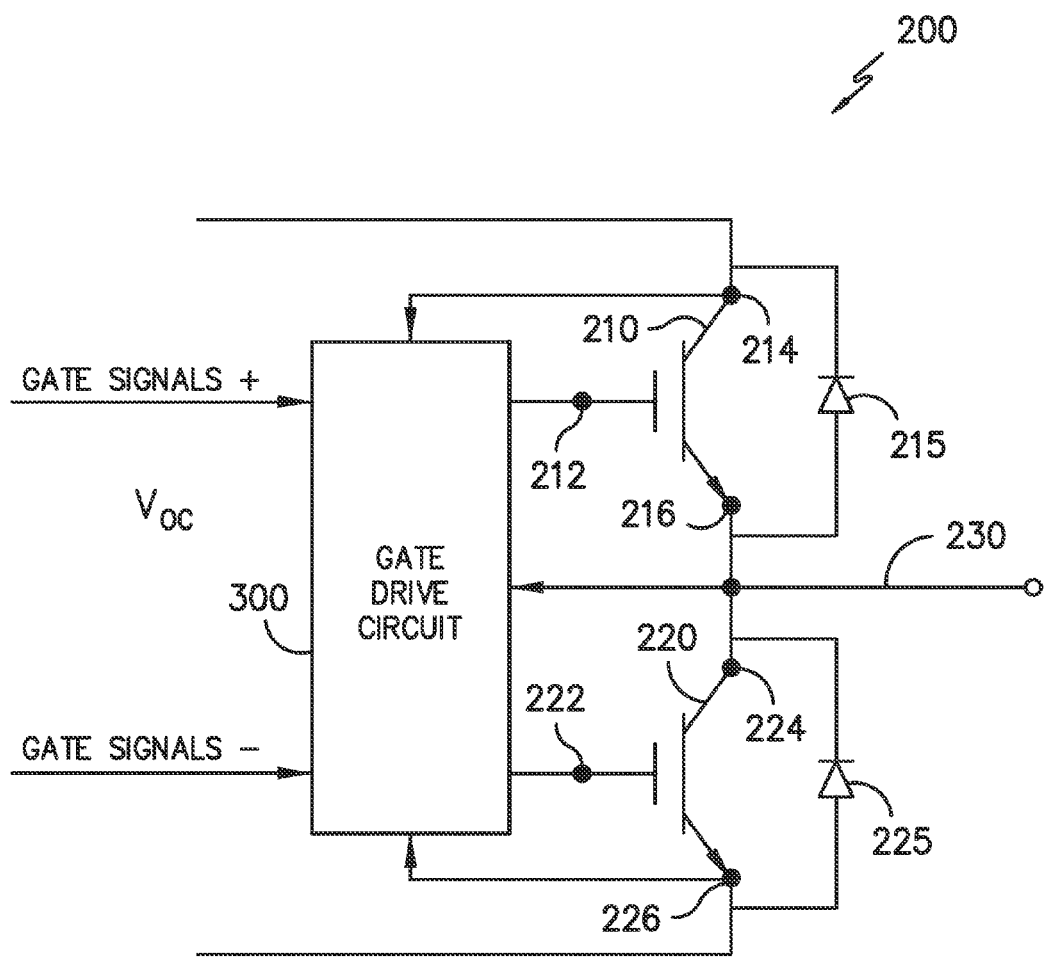
FIG. 3 illustrates one embodiment of a bridge circuit according to the present disclosure.

With reference now to FIGS. 3-9, example embodiments of the present disclosure will now be discussed in detail. FIG. 3 illustrates an example bridge circuit 200 that can be used, for instance, in a power converter of a wind-driven power generation system. Thus, at a system level, the bridge circuit of the present disclosure is capable of providing increased converter and/or system efficiency and/or reliability, increased power output for the power converter and/or system, and/or an increased margin in IGBT junction temperature. Accordingly, the bridge/gate drive circuit of the present disclosure can operate through a line voltage transient without tripping or failing, thereby providing better ride-through capabilities of the wind-driven power generation system.

As shown, the bridge circuit 200 includes a first IGBT 210 (e.g. an "upper" IGBT) and a second IGBT 220 (e.g. a "lower" IGBT). The first IGBT 210 can include a gate 212, a collector 214, and an emitter 216. Similarly, the second IGBT 220 can include a gate 222, a collector 224, and an emitter 226. A first freewheeling diode 215 can be coupled in parallel with the first IGBT 210. A second freewheeling diode 225 can be coupled in parallel with the second IGBT 220. The first freewheeling diode 215 and the second freewheeling diode 225 can exhibit reverse recovery characteristics when switching from a conducting state to a blocking state. More particularly, when switching from a conducting state to a blocking state, a large current can flow through the diode in the reverse direction for a short time until a reverse recovery charge is depleted.

The bridge circuit 200 can also include a gate drive circuit 300. The gate drive circuit 300 can control the gate-emitter voltages of the respective gates of the first IGBT 210 and the second IGBT 220 to control the switching of the first IGBT 210 and the second IGBT 220. For instance, the gate drive circuit 300 can provide pulse width modulation (PWM)

commands to the first IGBT 210 and the second IGBT 220 to convert an alternating current power at the input 230 of the bridge circuit 200 to a direct current power or vice versa.

Figure 4:
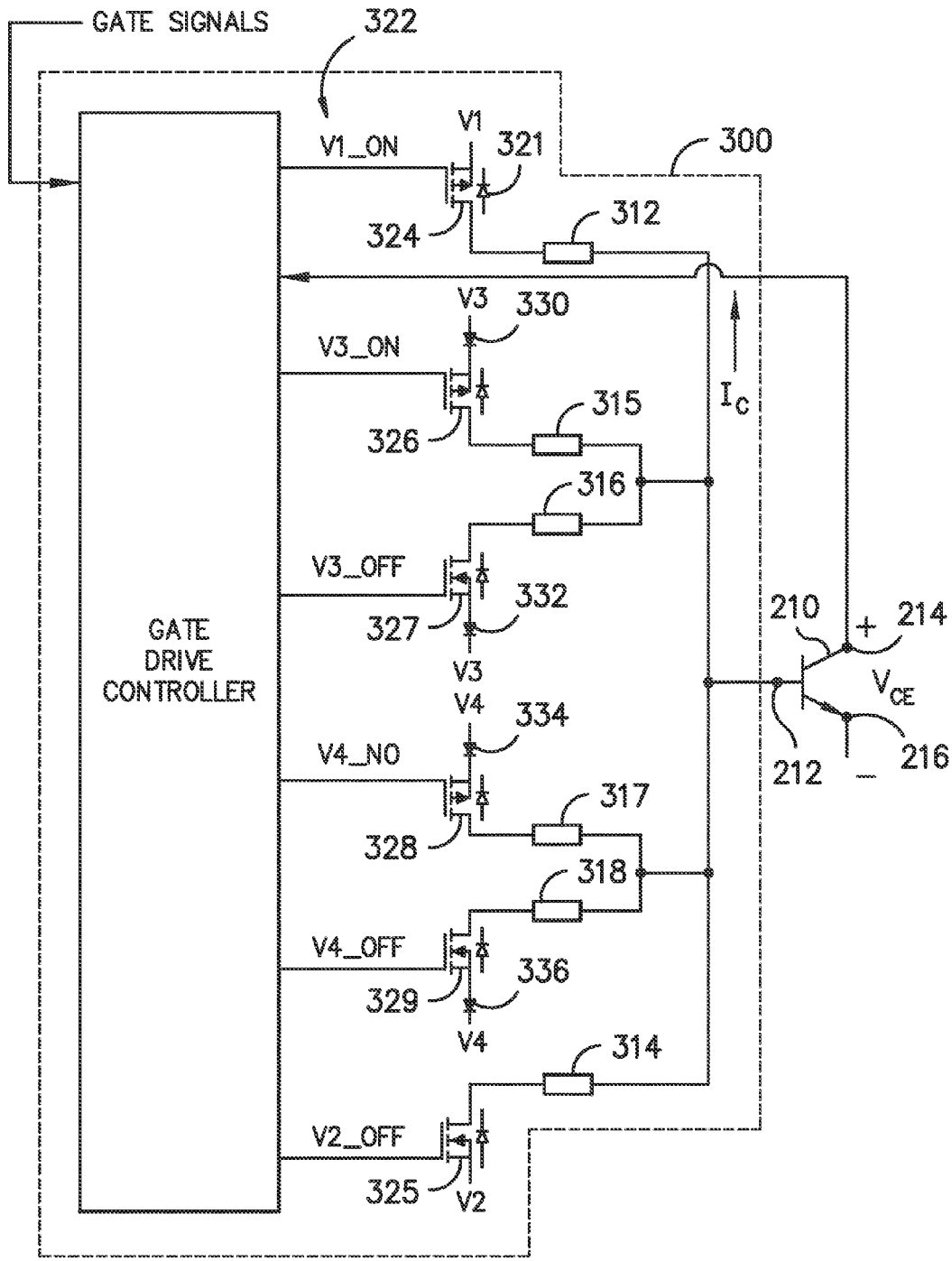
FIG. 4 illustrates one embodiment of a gate drive circuit for an IGBT according to the present disclosure.

FIG. 4 depicts an example gate drive circuit 300 according to an example embodiment of the present disclosure. The gate drive circuit 300 will be discussed with reference to controlling a gate-emitter voltage of the first IGBT 210. The gate drive circuit 300 can be configured to control the gate-emitter voltage of additional IGBTs, such as the second IGBT 220 shown in FIG. 3. As shown, the gate drive circuit 300 includes a gate drive controller 310 that is configured to provide one or more voltage commands via one of the gate resistors 312, 314, 315, 316, 317, 318 to the gate 212 of the IGBT 210 to control operation of the IGBT 210. Further, the gate drive controller 310 can include one or more control devices or circuits, such as one or more controllers, microprocessors, logic devices, memory units, microcontrollers, or other control devices. Further, the gate drive controller 310 can receive commands (e.g. PWM commands) or gate signals from other system controllers, such as controller for a power generation system in which the gate drive circuit 300 is used.

In one example embodiment, the gate drive controller 310 can include one or more processors and one or more computer-readable media. The one or more processors can be configured to execute computer-readable instructions stored in the one or more computer-readable media to cause the gate drive controller 310 to perform operations, such as applying a voltage level to the gate 212 of the IGBT 210 in accordance with example aspects of the present disclosure.

More specifically, as shown in FIG. 4, the gate drive circuit 300 may include a plurality of primary transistor 324, 325 coupled between the gate drive controller 310 and the IGBT 210 and a plurality of primary gate resistors 312, 314 connected in series with each of the primary transistors 324, 325. In addition, the gate drive circuit 300 may include one or more secondary transistors (e.g. 326, 327, 328, 329) connected in parallel with the primary gate resistors 312, 314. Thus, in certain embodiments, the gate drive circuit 300 may also optionally include one or more secondary gate resistors 315, 316, 317, 318 connected in series with each of the secondary transistors 326, 327, 328, 329 and in parallel with the primary gate resistors 312, 314.

It should be understood that the primary and secondary transistors 324, 325, 326, 327, 328, 329 may be any suitable transistors known in the art. For example, in certain embodiments, the transistors 324, 325, 326, 327, 328, 329 may be metal-oxide-semiconductor field-effect transistors (MOSFETs). Thus, as shown, each of the secondary MOSFETs 326, 327, 328, 329 may include at least one diode 330, 332, 334, 336 connected in series therewith, since the MOSFETs 326, 327, 328, 329 always conduct current in the reverse direction. Thus, one of the primary or secondary transistors 324, 325, 326, 327, 328, 329 is configured to receive a voltage command (e.g. V1_ON, V2_OFF, V3_ON, V3_OFF, V4_ON, and V4_OFF) from the gate drive controller 310 and provide a corresponding voltage level to the IGBT 210 via one of the primary or secondary gate resistors 312, 314, 315, 316, 317, 318 so as to control the on-off behavior of the IGBT 210.

According to particular aspects of the present disclosure, the gate drive controller 310 can provide four different voltage levels to the gate 212 of the IGBT 210 via the primary or secondary gate resistors 312, 314, 315, 316, 317, 318. The four different voltage levels correspond to different operating modes of the IGBT 210. For example, a first operating mode can be an "IGBT ON" operating mode of the IGBT 210. More specifically, as shown in FIG. 4, one of the voltage levels may include a first voltage (e.g. V1) configured to turn on the IGBT 210 via the first primary gate resistor 312. The IGBT ON mode can correspond to a period of time when the IGBT 210 is turned on such that current flows through the collector 214 and emitter 216 of the IGBT 210. Thus, during the IGBT ON mode, the gate drive controller 310 can send the voltage command (e.g. V1_ON) to the first primary transistor 324 such that the first voltage V1 is applied to the gate 212 of the IGBT 210 in a large signal manner. The first voltage V1 can be sufficiently greater than the threshold voltage for the IGBT 210 so that the IGBT 210 is fully on. For instance, the first voltage V1 can be in the range of about 10V to about 15V, such as about 15V. As used herein, the term "about" used in relation with a specified value is intended to refer to within 20% of the specified value.

A second operating mode can be an "IGBT OFF" operating mode of the IGBT 210. More specifically, as shown in FIG. 4, one of the voltage levels may include a second voltage (e.g. V2) configured to turn off the IGBT 210 via the second primary gate resistor 314. The IGBT OFF mode can correspond to a period of time when the IGBT 210 is turned off such that current flowing through the collector 214 and emitter 216 of the IGBT 210 is limited. During the IGBT OFF mode, the gate drive controller 310 can send the voltage command (e.g. V2_OFF) to the second primary transistor 325 such that the second voltage (e.g. V2) is applied to the gate 212 of the IGBT 210 in a large signal manner. The second voltage V2 can be sufficiently less than the threshold voltage for the IGBT 210 so that the IGBT is fully off For instance, the second voltage V2 can be in the range of about −2V to about −9V, such as about −9V.

During turn off of the IGBT 210 (e.g. transitioning from the IGBT ON mode to the IGBT OFF mode), the gate drive controller 310 can control the IGBT 210 in a small signal manner by controlling the gate-emitter voltage of the IGBT 210 to be near the threshold voltage. More particularly, the gate drive controller 310 can operate the IGBT 210 in an "IGBT Turn-Off" mode for a first turn off time period. For example, as shown in FIG. 4, the gate drive controller 310 may be configured to send a voltage command (e.g. V3_OFF) to the second secondary transistor 327. The second secondary transistor 327 can then provide a corresponding voltage level V3 to the IGBT 210 via the second secondary gate resistor 316. The third voltage (e.g. V3) can be a voltage near the threshold voltage to control the IGBT 210 in a small signal manner, such as a positive voltage (e.g. a voltage greater than 0V) that is less than the first voltage and greater than the second voltage. For instance, the third voltage can be in the range of about 0V to about 8V, such as about 6V. The gate drive controller 310 can operate the IGBT 210 in an IGBT Turn-Off Mode while a non-zero collector current $I_c$ is flowing in the collector 214 of the IGBT 210 to reduce dv/dt of the collector-emitter voltage $V_{CE}$ during turn off The reduction of dv/dt can limit voltage peaks in the collector-emitter voltage $V_{CE}$.

Subsequent to the first turn off period, the gate drive controller 310 can transition to operate the IGBT 210 in a "Diode Recovery" mode for a second turn off time period. The Diode Recovery mode can correspond to a period of time of diode reverse recovery of the freewheeling diode 215 coupled in parallel with the IGBT 210 (FIG. 3). During the Diode Recovery mode, the gate drive controller 310 may be configured to send a voltage command (e.g. V4_OFF) to the fourth secondary transistor 329. The fourth secondary transistor 329 can then provide a corresponding voltage level (e.g. V4) to the IGBT 210 via the fourth secondary gate resistor 318. The fourth voltage can be a voltage near the threshold voltage of the IGBT 210 to control the IGBT 210 in a small signal manner, such as a positive voltage (e.g. a voltage greater than 0V) that is less than the third voltage and greater than the second voltage. For instance, the fourth voltage can be in the range of about 1V to about 5V, such as about 1V. The fourth voltage can be applied for a time sufficient for the freewheeling diode 215 to deplete its reverse recovery charge, at which point the gate drive controller 310 can apply the second voltage to operate the IGBT 210 in the IGBT OFF mode.

Figure 6:
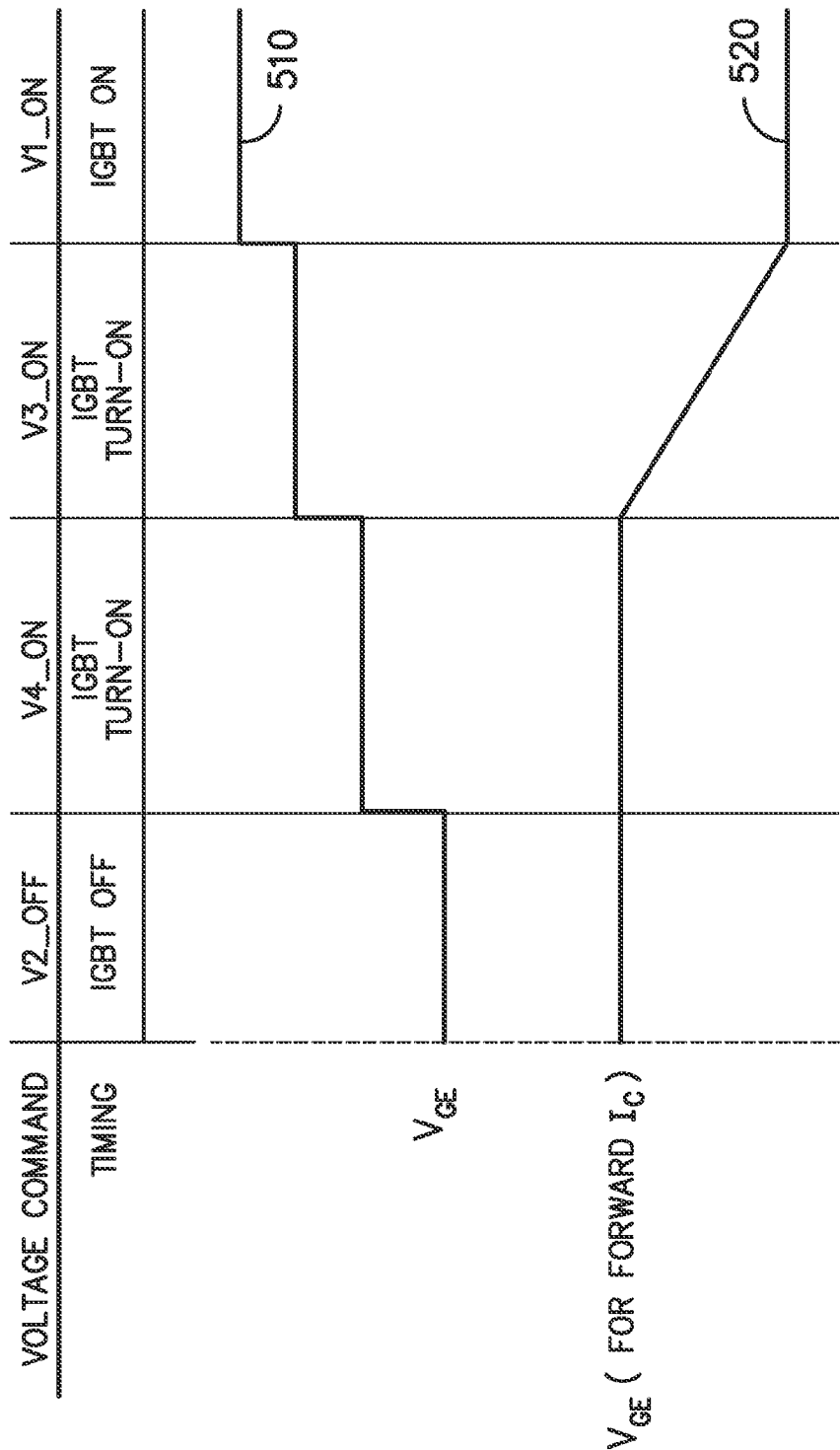
FIG. 6 illustrates one embodiment of a gate drive waveform that can be applied a gate drive controller during a turn-on mode according to the present disclosure.

During turn on of the IGBT 210 (e.g. transitioning from the IGBT OFF mode to the IGBT ON mode), the gate drive controller 310 may also control the IGBT 210 in a small signal manner by controlling the gate-emitter voltage of the IGBT 210 to be near the threshold voltage. More particularly, the gate drive controller 310 can operate the IGBT 210 in an "IGBT Turn-On" mode, for example, by sending one or more intermediate voltage commands (e.g. V4_ON and V3_ON) to the third secondary transistor 328 and then to the first secondary transistor 326, consecutively. For example, as a first step, the gate drive controller 310 can provide the voltage command (e.g. V4_ON) to the third secondary transistor 328. The third secondary transistor 328 can then provide a corresponding voltage level (e.g. V4) to the IGBT 210 via the third secondary gate resistor 317. As mentioned, the voltage V4 can be near the threshold voltage to control the IGBT 210 in a small signal manner, such as a positive voltage that is less than the third voltage and greater than the second voltage. For instance, as mentioned, the voltage V4 can be in the range of about 1V to about 5V, such as about 1V. Next, the gate drive controller 310 can provide another voltage command (e.g. V3_ON) to the first secondary transistor 326. The first secondary transistor 326 can then provide a corresponding voltage level (e.g. V3) to the IGBT 210 via the first secondary gate resistor 315. FIG. 6 illustrates one embodiment of the gate-emitter voltage ($V_{CE}$) 510 of the IGBT 210 and corresponding collector-emitter voltage ($V_{CE}$) 520 during IGBT ON mode.

Figure 5:
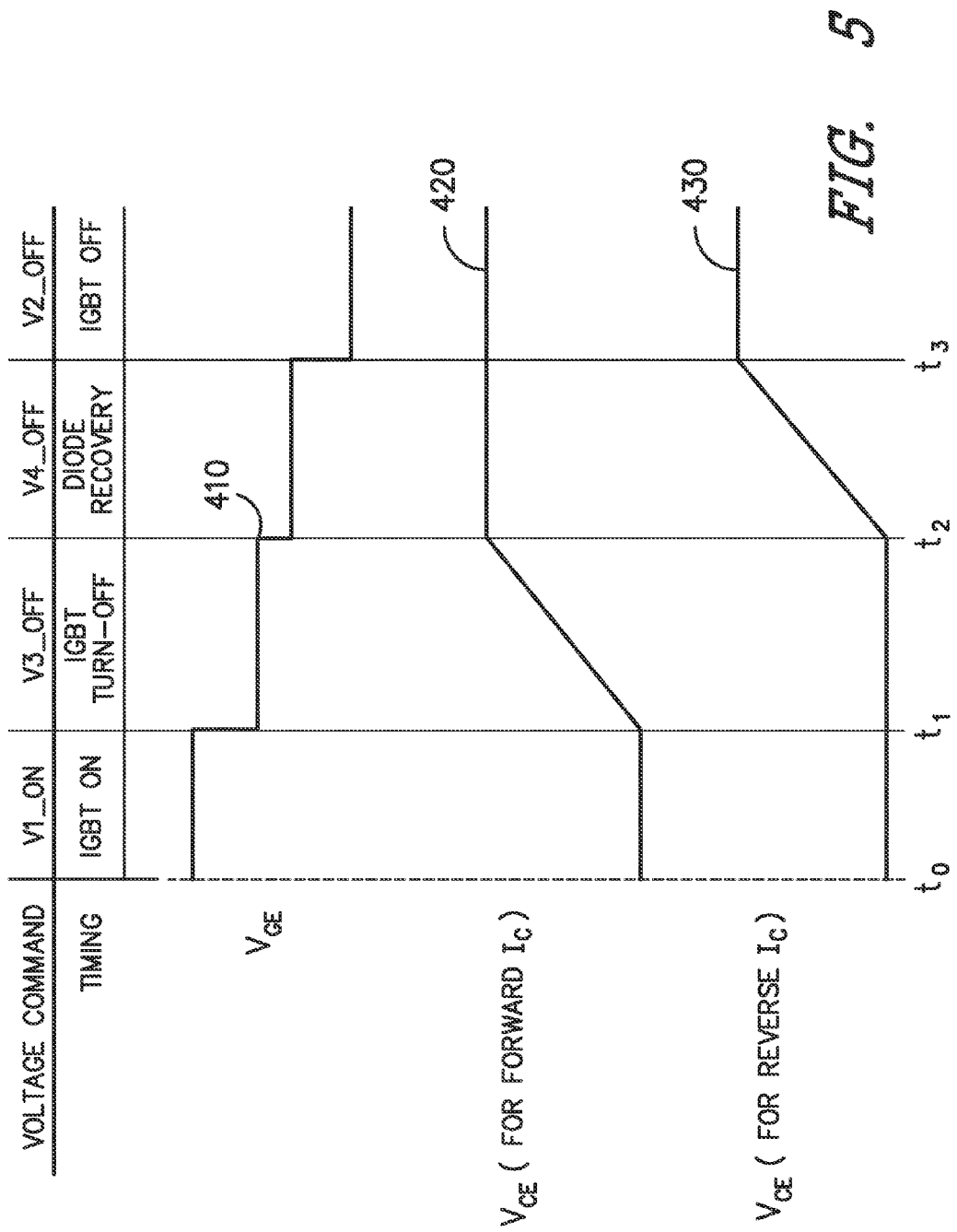
FIG. 5 illustrates one embodiment of a gate drive waveform that can be applied a gate drive controller during a turn-off mode according to the present disclosure.

FIG. 5 depicts a graphical representation of a voltage waveform 410 applied by the gate drive controller 310 during turn off of the IGBT 210. Waveform 410 represents the voltage applied by the gate drive controller 310 to the gate 212 of the IGBT 210. As shown, the gate drive controller 310 can apply a first voltage (e.g. V1) from time $t_0$ to time $t_1$ to operate the IGBT 210 in an IGBT ON mode. The gate drive controller 310 can apply a second voltage (e.g. V2) after a time $t_3$ to operate the IGBT 210 in an IGBT OFF mode. Between the IGBT ON mode and the IGBT OFF mode, the gate drive controller 310 can apply a third voltage (e.g. V3) to the gate 212 of the IGBT 210 to operate the IGBT 210 in a IGBT Turn-Off Mode for a first turn off period from time $t_1$ to time $t_2$. Subsequent to the first turn off period, the gate drive controller 310 can apply a fourth voltage (e.g. V4) to the gate 212 of the IGBT 210 to operate the IGBT 210 in a Diode Recovery mode for a second turn off period from time $t_2$ to time $t_3$.

FIG. 5 further depicts two cases of collector-emitter voltage ($V_{CE}$) resulting from driving the IGBT 210 in accordance with waveform 410. Waveform 420 represents $V_{CE}$ for current flowing in the IGBT 210 (forward collector current $I_C$). Waveform 430 represents $V_{GE}$ for current flowing in the freewheeling diode 215 coupled in parallel with the IGBT 210 (reverse collector current $I_C$). The transition between the first turn off period corresponding to the IGBT Turn-Off mode to the second turn off period corresponding to the Diode Recovery mode occurs at transition time $t_2$. The transition time $t_2$ can correspond to a time when diode reverse recovery begins to occur. For instance, in the example bridge circuit 200 depicted in FIG. 3, the transition time $t_2$ can occur when the other IGBT in the bridge circuit 200 is turned on. For instance, if the freewheeling diode 215 is conducting, the transition time $t_2$ can occur when the second IGBT 220 is turned on. If the freewheeling diode 225 is conducting, the transition time $t_2$ can occur when the first IGBT 210 is turned on.

In one example embodiment, the gate drive controller 310 can be configured to transition between the first turn off period and the second turn off period at a predetermined time. More particularly, the length of the IGBT Turn-Off mode period can be a fixed value determined based on the longest turn-off time of the IGBT 210. The transition time $t_2$ can be a predetermined value based on the length of the IGBT Turn-Off mode period. The length of the Diode Recovery mode period can also be a fixed value determined based on the longest period of reverse recovery of the freewheeling diode 215 coupled in parallel with the IGBT 210.

In other example embodiments, the length of the first turn off period corresponding to the IGBT Turn-Off mode and the length of the second turn off period corresponding to the Diode Recovery mode can be determined based on monitored parameters of the system. For example, the gate drive controller 310 can be configured to transition from the first turn off period to the second turn off period based at least in part on a signal indicative of the other IGBT 220 in the bridge circuit 200 being turned on.

As another example, the length of the first turn off period and the length of the second turn off period can be controlled by the gate drive controller 310 based at least in part on the collector current $I_c$ of the IGBT 210. For instance, the gate drive controller 310 can monitor collector current $I_C$ using a suitable current sensor. The gate drive controller 310 can be configured to apply a third voltage for a certain time period, while the collector current $I_c$ is non-zero. The gate drive controller 310 can be configured to transition between the first turn off period and the second turn off period based at least in part on the direction of the collector current $I_c$ (e.g. whether the collector current is positive or negative). The gate drive controller 310 can control the gate-emitter voltage of the IGBT 210 based on other suitable monitored parameters, such as temperature, collector current, DC bus voltage, di/dt of collector current, dv/dt of collector-emitter voltage, and other suitable implementations.

In yet another example, the transition between the third voltage and the fourth voltage can occur at least in part as a result of a termination of a miller plateau current resulting from completion of the turn off dv/dt of the IGBT 210. More particularly, during turn off of the IGBT 210. More particularly, a miller plateau current resulting from dv/dt of the IGBT 210 can be extracted during turn off of the transistor during application of the third voltage. When the dv/dt of the IGBT 210 is complete, the miller plateau voltage can no longer feed the gate of the IGBT 210, resulting in a transition to the fourth voltage. Where the miller Plateau voltage can accept and source current near the gate threshold voltage, it can be used to in order to create the third or fourth voltage.

Figure 7:
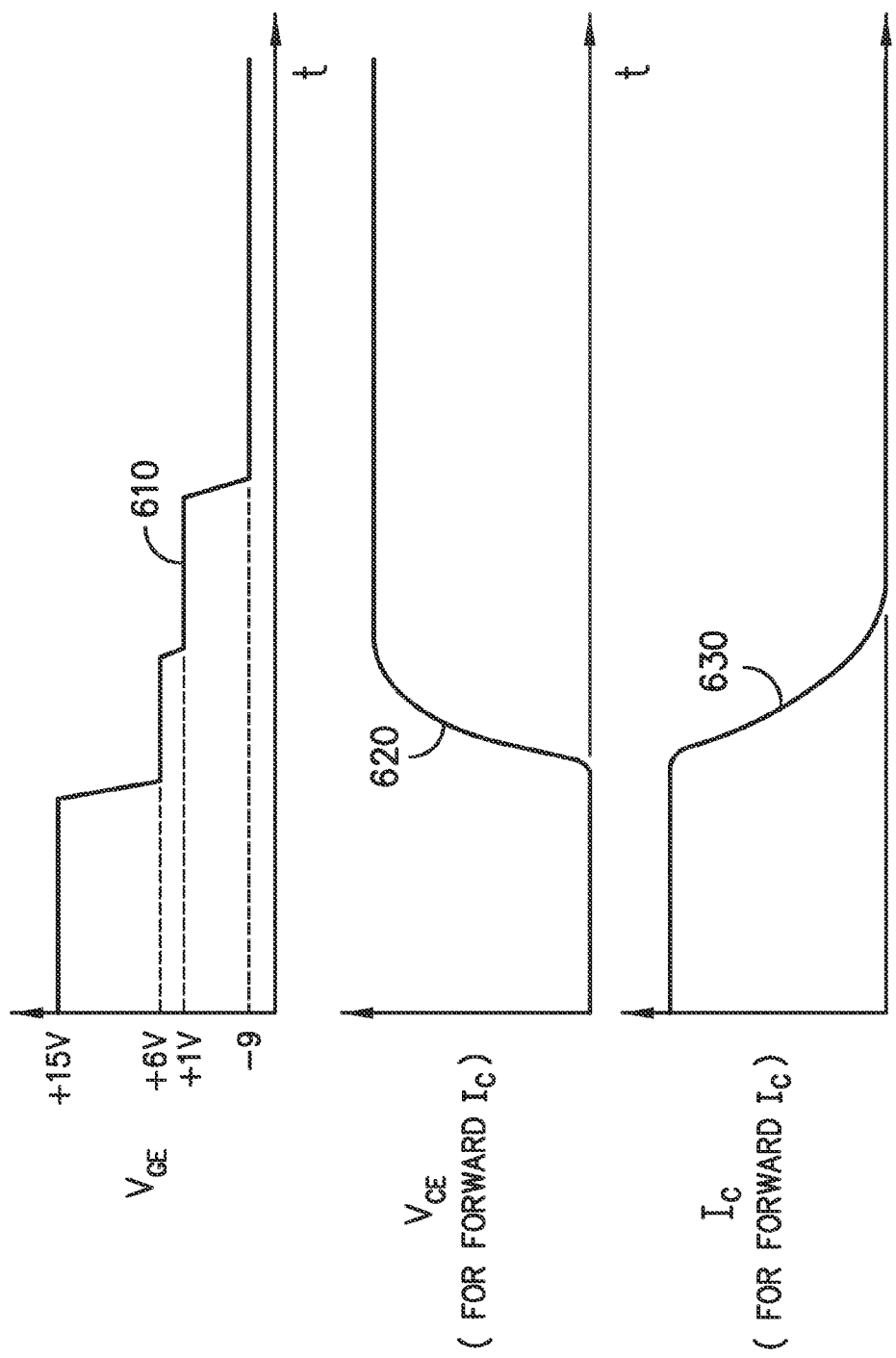
FIGS. 7 and 8 illustrate simulation results for an example gate drive circuit for an IGBT according to one embodiment of the present disclosure.
Figure 8:
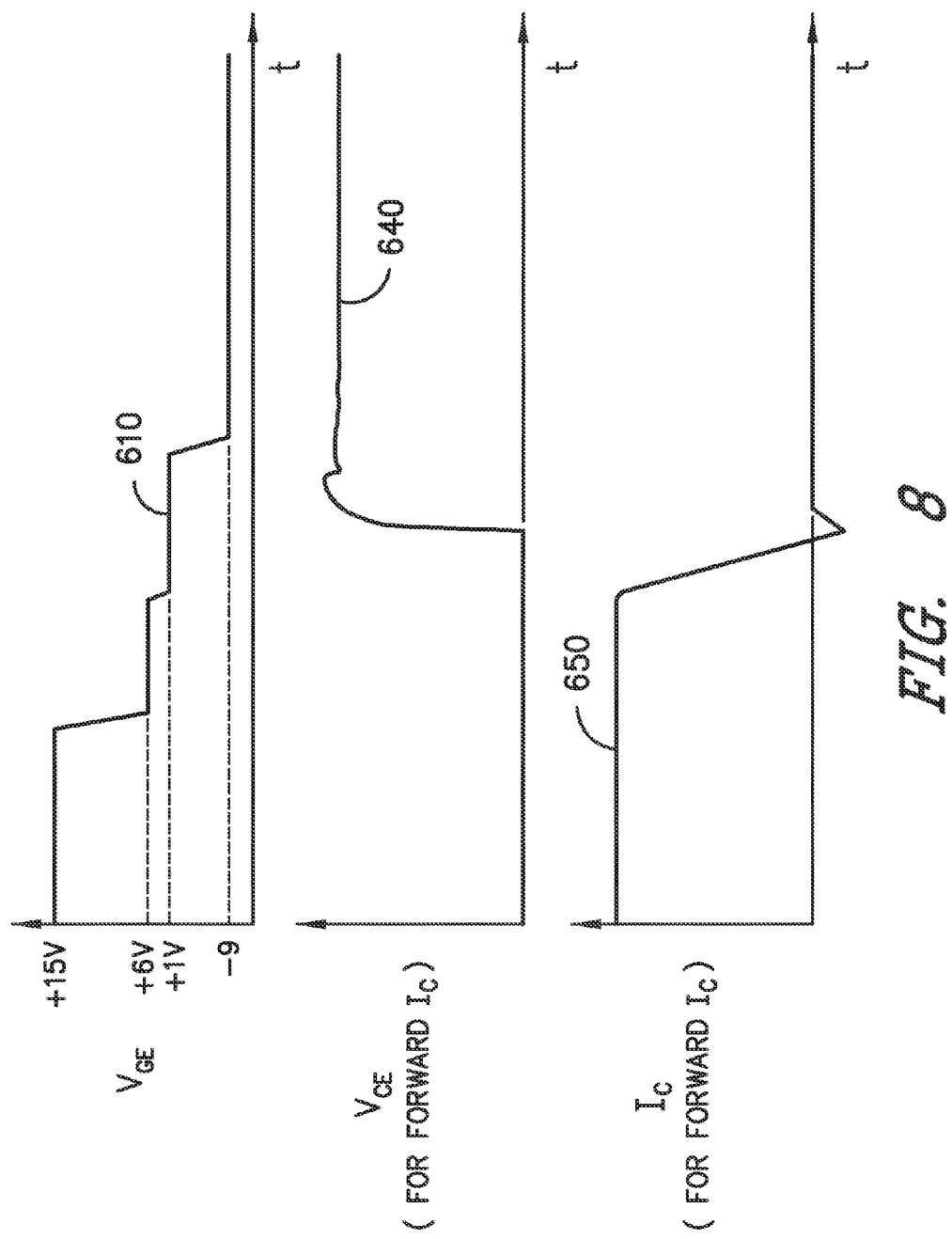

FIGS. 7 and 8 depict simulation results for an example gate drive circuit for an IGBT according to an embodiment of the present disclosure. Waveform 610 depicts the voltage applied by an example gate drive controller to the gate of an IGBT. As shown, the gate drive controller can apply a voltage of about 15V when the IGBT is turned on, a voltage of about 6V for the first turn off period, a voltage of about 1V for the second turn off period, and a voltage of about −9V when the IGBT is turned off Waveform 620 of FIG. 7 depicts the collector-emitter voltage $V_{CE}$ associated with forward flowing collector current (e.g. current in the IGBT) during turn off. Waveform 630 of FIG. 7 depict collector current $I_C$ for forward flowing collector current. Waveform 640 of FIG. 8 depicts the collector-emitter voltage $V_{CE}$ associated with reverse flowing collector current (e.g. current in freewheeling diode) during turn off. Waveform 650 of FIG. 8 depicts the collector current $I_C$ for reverse flowing collector current. As demonstrated, the gate drive controller transitions from the first turn off period where 6V is applied to a second turn off period where 1V is applied for diode reverse recovery when the collector current reaches about zero. The collector-emitter voltage exhibits good dv/dt characteristics with no significant overvoltage condition. The collector current $I_C$ also exhibits good di/dt characteristics during the first and second turn off periods.

Figure 9:
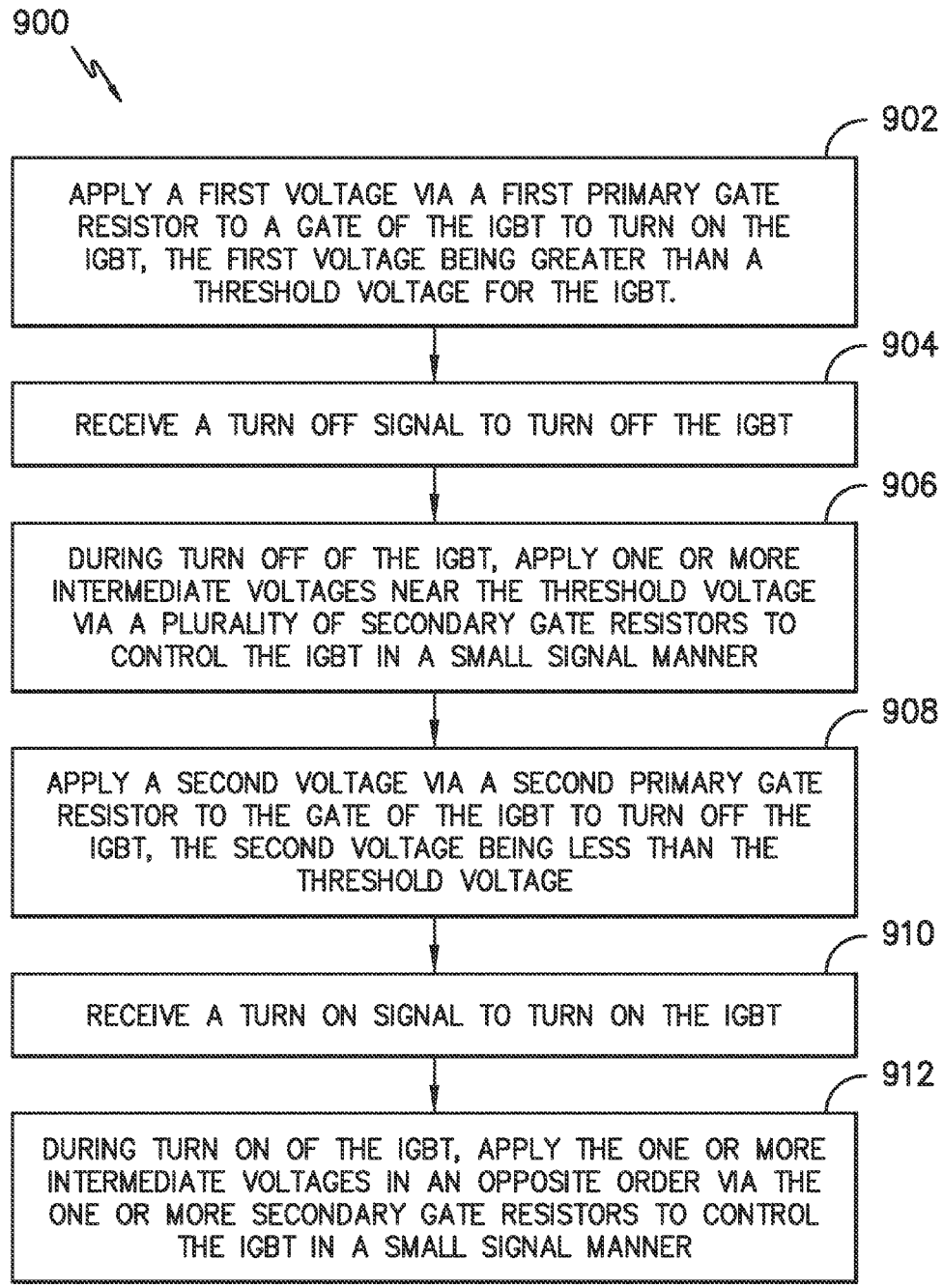
FIG. 9 illustrates a flow diagram of one embodiment of a method of gating an insulated gate bipolar transistor (IGBT) used in a power converter of a wind-driven power generation system.

Referring now to FIG. 9, a flow diagram of one embodiment of a method 900 of gating IGBT used in a power converter of a wind-driven power generation system is illustrated. As shown at 902, the method 900 includes applying a first voltage via a first primary gate resistor to a gate of the IGBT to turn on the IGBT, the first voltage being greater than a threshold voltage for the IGBT. At 904, the method 900 includes receiving a turn off signal to turn off the IGBT. During turn off of the IGBT, the method 900 further includes applying one or more intermediate voltages near the threshold voltage via a plurality of secondary gate resistors to control the IGBT in a small signal manner (step 906). At 908, the method 900 also includes applying a second voltage via a second primary gate resistor to the gate of the IGBT to turn off the IGBT, the second voltage being less than the threshold voltage. Subsequently, the method 900 may also include receiving a turn on signal to turn on the IGBT (step 910). Thus, during turn on of the IGBT, the method 900 may also include applying the one or more intermediate voltages in an opposite order via the one or more secondary gate resistors to control the IGBT in a small signal manner (step 912).

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A gate drive circuit for applying a gate voltage to a gate of a semiconductor switching device, the gate drive circuit comprising:
   a gate drive controller providing one or more voltage commands for operating the semiconductor switching device;
   a plurality of primary gate resistors coupled between the gate drive controller and the semiconductor switching device;
   a plurality of secondary gate resistors connected in parallel with the primary gate resistors;
   a primary transistor connected in series with each of the primary gate resistors; and,
   one or more secondary transistors connected in parallel with the primary gate resistors,
   wherein one of the primary or secondary transistors receives the one or more voltage commands from the gate drive controller and provides one or more corresponding voltage levels to the semiconductor switching device so as to control the on-off behavior of the semiconductor switching device.

2. The gate drive circuit of claim 1, wherein at least one secondary transistor is connected in series with each of the secondary gate resistors.

3. The gate drive circuit of claim 1, wherein the semiconductor switching device comprises an insulated gate bipolar transistor (IGBT).

4. The gate drive circuit of claim 3, wherein the IGBT is configured with a bridge circuit of a power converter of a wind-drive power generation system.

5. The gate drive circuit of claim 1, wherein the primary and secondary transistors comprise a metal-oxide-semiconductor field-effect transistor (MOSFET).

6. The gate drive circuit of claim 5, further comprising at least one diode connected in series with the secondary MOSFETs.

7. The gate drive circuit of claim 1, wherein the corresponding voltage levels comprise at least a first voltage and a second voltage, the first voltage being configured to turn on the semiconductor switching device via a first primary gate resistor, the first voltage being greater than a threshold voltage for the semiconductor switching device, the second voltage being configured to turn off the semiconductor switching device via a second primary gate resistor, the second voltage being less than the threshold voltage.

8. The gate drive circuit of claim 7, wherein during turn off of the semiconductor switching device, the gate drive controller is further configured to apply a third voltage to the gate of the semiconductor switching device via a second secondary gate resistor for a first turn off period, the third voltage being less than the first voltage but greater than the second voltage.

9. The gate drive circuit of claim 8, wherein the gate drive controller is further configured to apply a fourth voltage to the gate of the semiconductor switching device via a fourth secondary gate resistor for a second turn off period, the fourth voltage being less than the third voltage but greater than the second voltage.

10. The gate drive circuit of claim 9, wherein during turn on of the semiconductor switching device, the gate drive controller is further configured to apply the fourth voltage to the gate of the semiconductor switching device via a third secondary gate resistor for a first turn on period, the fourth voltage being less than the third voltage but greater than the second voltage.

11. The gate drive circuit of claim 10, wherein the gate drive controller is further configured to apply the third voltage to the gate of the semiconductor switching device via a first secondary gate resistor for a second turn on period, the third voltage being less than the first voltage but greater than the second voltage.

12. A bridge circuit used in a power converter of a power system, the bridge circuit comprising:
   a first insulated gate bipolar transistor (IGBT) having a gate, a collector, and an emitter;
   a second IGBT coupled in series with the first IGBT;
   a diode coupled in parallel with the first IGBT;

a gate drive circuit configured to apply a voltage to the gate of the first IGBT, the gate drive circuit comprising:
a gate drive controller providing one or more voltage commands for operating the first IGBT;
a plurality of primary gate resistors coupled between the gate drive controller and the first IGBT;
a plurality of gate resistors connected in parallel with the primary gate resistors;
a primary transistor connected in series with each of the primary gate resistors; and,
a secondary transistor connected in series with each of the secondary gate resistors,
wherein one of the primary or secondary transistors receives the one or more voltage commands from the gate drive controller and provides one or more corresponding voltage levels to the semiconductor switching device via one of the primary or secondary gate resistors so as to control the on-off behavior of the semiconductor switching device.

13. The gate drive circuit of claim 12, wherein the primary and secondary transistors comprise a metal-oxide-semiconductor field-effect transistor (MOSFET).

14. The gate drive circuit of claim 13, further comprising at least one diode connected in series with the secondary MOSFETs.

15. The gate drive circuit of claim 12, wherein the corresponding voltage levels comprise at least a first voltage and a second voltage, the first voltage configured to turn on the first IGBT via a first primary gate resistor, the first voltage being greater than a threshold voltage for the semiconductor switching device, the second voltage configured to turn off the first IGBT via a second primary gate resistor, the second voltage being less than the threshold voltage.

16. The gate drive circuit of claim 15, wherein during turn off of the first IGBT, the gate drive controller is further configured to apply a third voltage to the gate of the first IGBT via a second secondary gate resistor for a first turn off period, the third voltage being less than the first voltage but greater than the second voltage.

17. The gate drive circuit of claim 16, wherein the gate drive controller is further configured to apply a fourth voltage to the gate of the first IGBT via a fourth secondary gate resistor for a second turn off period, the fourth voltage being less than the third voltage but greater than the second voltage.

18. The gate drive circuit of claim 17, wherein during turn on of the first IGBT, the gate drive controller is further configured to apply the fourth voltage to the gate of the first IGBT via a third secondary gate resistor for a first turn on period, the fourth voltage being less than the third voltage but greater than the second voltage, and wherein the gate drive controller is further configured to apply the third voltage to the gate of the semiconductor switching device via a first secondary gate resistor for a second turn on period, the third voltage being less than the first voltage but greater than the second voltage.

19. A. method of gating an insulated gate bipolar transistor (IGBT) used in a power converter of a wind-driven power generation system, the method. comprising:
applying a first voltage via. a first primary gate resistor to a gate of the :IGBT to turn on the IGBT, the first voltage being greater than a threshold voltage for the IGBT;
receiving a turn off signal to turn off the IGBT; and,
subsequent to receiving the turn off signal, applying a second voltage via a second primary gate resistor to the gate of the IGBT to turn off the IGBT, the second voltage being less than the threshold voltage;
wherein during turn off of the IGBT, the method further comprises applying one or more intermediate voltages near the threshold voltage via a plurality of secondary gate resistors coupled in parallel with the primary gate resistors to control the IGBT in a small signal manner, and
wherein during turn on of the IGBT, the method further comprises applying the one or more intermediate voltages in an opposite order via the one or more secondary gate resistors to control the IGBT in a small signal manner.

* * * * *